United States Patent
Lee

(10) Patent No.: US 9,871,052 B2
(45) Date of Patent: Jan. 16, 2018

(54) THREE-DIMENSIONAL MEMORY DEVICE HAVING RING-SHAPED ETCH-STOP PATTERNS INTERPOSED BETWEEN LOWER AND UPPER LAYER STACKS

(71) Applicant: SK hynix Inc., Gyeonggi-do (KR)

(72) Inventor: Hyun Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/076,812

(22) Filed: Mar. 22, 2016

(65) Prior Publication Data

US 2017/0110473 A1  Apr. 20, 2017

(30) Foreign Application Priority Data

Oct. 15, 2015  (KR) .......................... 10-2015-0144086

(51) Int. Cl.
   - H01L 27/1157  (2017.01)
   - H01L 27/11582  (2017.01)
   - H01L 21/768  (2006.01)

(52) U.S. Cl.
   CPC .. H01L 27/11582 (2013.01); H01L 21/76897 (2013.01)

(58) Field of Classification Search
   None
   See application file for complete search history.

(56) References Cited

U.S. PATENT DOCUMENTS

| | | | |
|---|---|---|---|
| 9,570,463 B1 * | 2/2017 | Zhang | H01L 29/66833 |
| 9,768,192 B1 * | 9/2017 | Nakamura | H01L 27/1157 |
| 9,780,034 B1 * | 10/2017 | Tsutsumi | H01L 23/5283 |
| 2010/0207193 A1 * | 8/2010 | Tanaka | H01L 27/11578 257/324 |
| 2011/0233646 A1 * | 9/2011 | Mizushima | H01L 27/11578 257/324 |
| 2012/0003800 A1 * | 1/2012 | Lee | H01L 27/11551 438/261 |
| 2012/0156848 A1 * | 6/2012 | Yang | H01L 27/11529 438/287 |
| 2013/0049095 A1 * | 2/2013 | Whang | H01L 27/11556 257/321 |
| 2015/0060976 A1 * | 3/2015 | Iguchi | H01L 29/66833 257/314 |
| 2015/0155296 A1 * | 6/2015 | Yoon | H01L 27/11582 257/324 |

FOREIGN PATENT DOCUMENTS

KR  1020150064520  6/2015

* cited by examiner

Primary Examiner — Marc Armand
Assistant Examiner — Younes Boulghassoul
(74) Attorney, Agent, or Firm — IP & T Group LLP

(57) ABSTRACT

A semiconductor device includes a first stack including a plurality of alternating layers of first interlayer insulating layers and first conductive patterns; a second stack including a plurality of alternating layers of second conductive patterns and second interlayer insulating layers, the second stack being positioned above the first stack; a plurality of pillar-structures each pillar structure passing through the first and second stacks; and a ring pattern layer disposed between the first and second stacks, the ring pattern layer comprising a plurality of ring patterns, each ring pattern surrounding each pillar-structure.

13 Claims, 11 Drawing Sheets

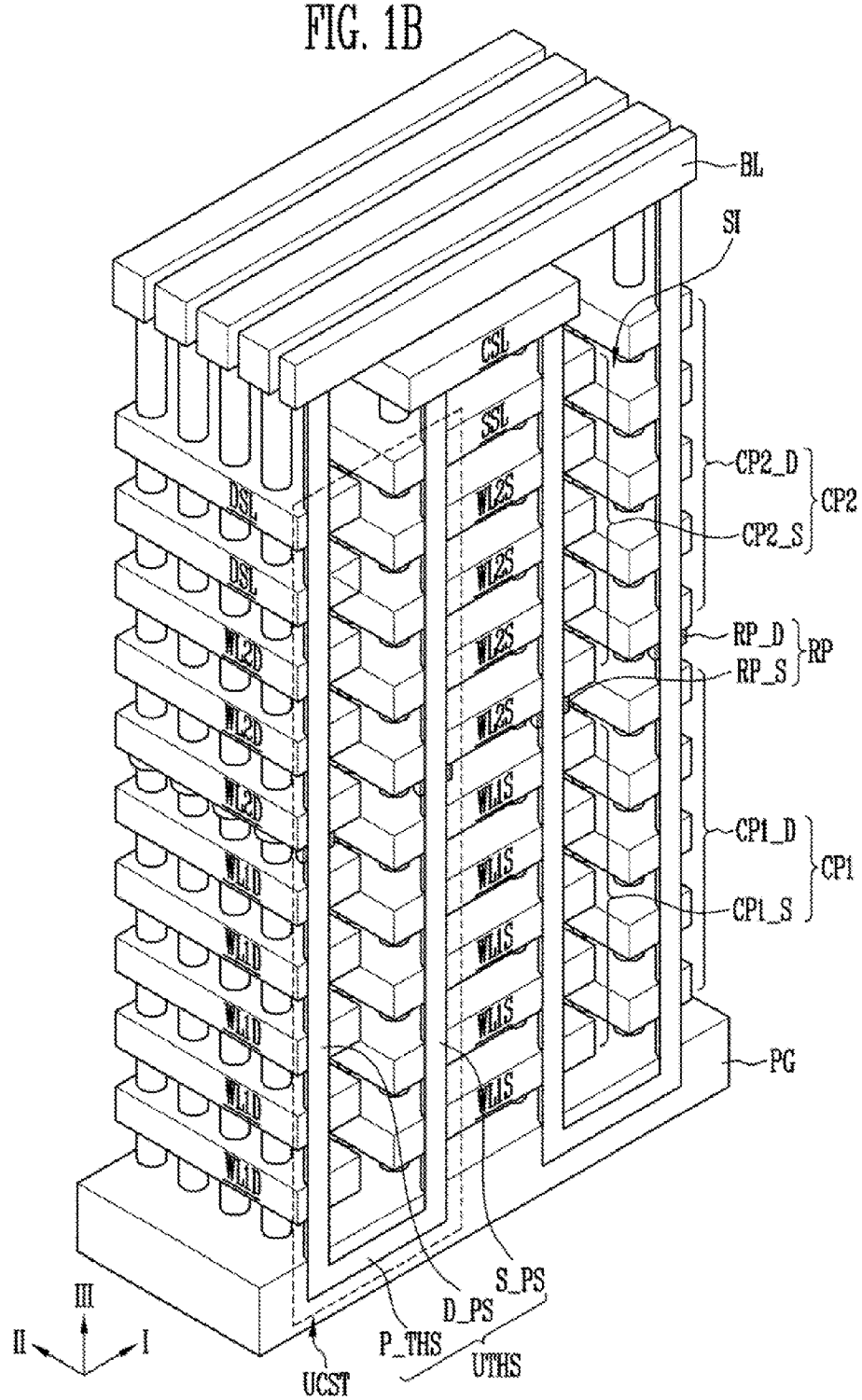

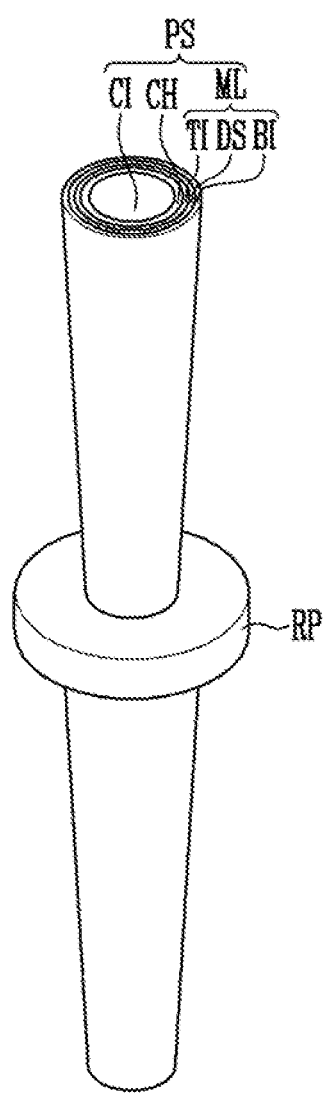
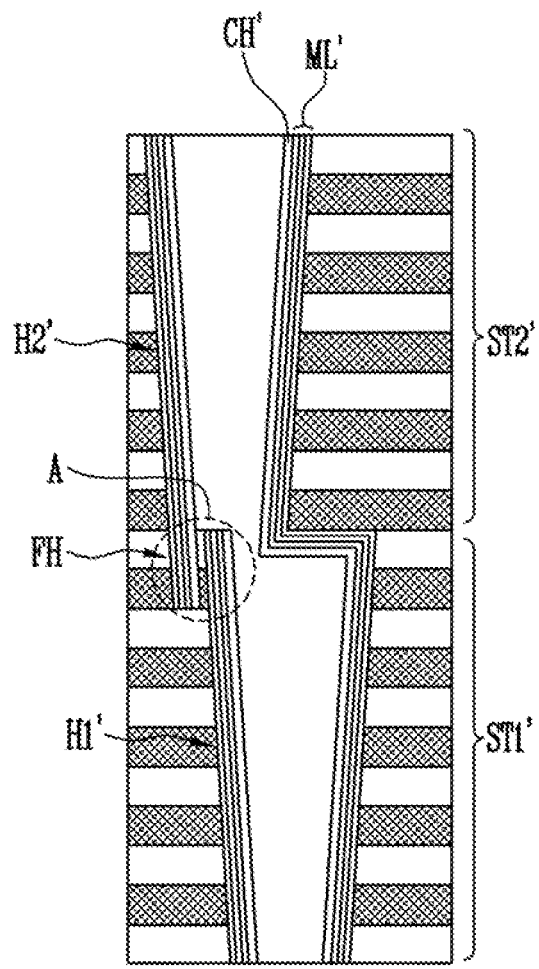
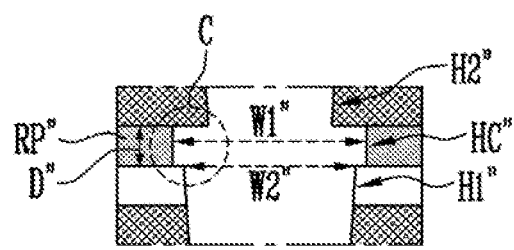

THREE-DIMENSIONAL MEMORY DEVICE HAVING RING-SHAPED ETCH-STOP PATTERNS INTERPOSED BETWEEN LOWER AND UPPER LAYER STACKS

CROSS-REFERENCE TO RELATED APPLICATION

The present application claims a priority to a Korean patent application number 10-2015-0144086 filed on Oct. 15, 2015, the entire disclosure of which is incorporated herein by reference in its entirety.

BACKGROUND

Technical Field

Embodiments of the present disclosure generally relate to a semiconductor device and, more particularly, to a semiconductor device including a stack structure and a method for manufacturing the same.

Discussion of Related Arts

Studies for improving the data capacity of semiconductor devices, such as the ones including a NAND flash memory device, have focused generally on achieving higher integration density of the memory cells employed for storing data. For this purpose, memory device having three-dimensional arrangements of memory cells have been suggested.

Generally, a three-dimensional memory device includes a stack of vertically alternating layers of interlayer insulating layers and conductive patterns. The stack is further vertically passed through by at least a hole, which may be filled with a pillar-structure including to form a pillar structure including a channel layer. In this manner, at the intersections between the channel layer and the conductive patterns, memory cells may be formed.

One way for further increasing the capacity of 3-Dimensional memory devices would be to increase the number of the interlayer insulating layers and the conductive patterns. In this regard, difficulties have been encountered in forming a single vertical hole completely passing through a vertically long stack having an increased number of stacked layers. For this reason, some have suggested an approach where the vertically-long stack is completely passed through by a combination of upper and lower vertical holes. However, alignment of the upper and lower holes may be problematic and may lead to various process defects.

SUMMARY

The present disclosure provides a semiconductor device with suppression of the process defects and, hence, an improved reliability, and a method for manufacturing the same.

In one aspect of the present disclosure, there is provided a semiconductor device comprising: a first stack including a plurality of alternating layers of first interlayer insulating layers and first conductive patterns; a second stack including a plurality of alternating layers of second conductive patterns and second interlayer insulating layers, the second stack being positioned above the first stack; a plurality of pillar-structures each pillar structure passing through the first and second stacks; and a ring pattern layer disposed between the first and second stacks, the ring pattern layer comprising a plurality of ring patterns, each ring pattern surrounding each pillar-structure.

In one aspect of the present disclosure, there is provided a method for manufacturing a semiconductor device, the method comprising: forming a first stack of vertical alternations of first material layers and second material layers; forming first holes passing through the first stack; filling the first holes respectively with through-sacrificial layers; forming ring patterns on the first stack, each ring pattern having an inner wall defining a center hole, the center hole overlapping one of the first holes; forming a second stack of vertical alternations of third material layers and fourth material layers on the ring patterns; forming second holes passing through the second stack, each second hole being coupled to each center hole to expose each of the through-sacrificial layers; removing the through-sacrificial layers to open the first holes; and forming the pillar-structures respectively in the second holes, the center holes, and the first holes.

BRIEF DESCRIPTION OF THE DRAWINGS

FIGS. 1A and 1B illustrate perspective views of semiconductor devices, according to embodiments of the present disclosure.

FIG. 3 illustrates an enlarged area at the vicinity of a connection of a pillar-structure with a ring pattern, according to an embodiment of the present disclosure.

FIGS. 4A and 4B illustrate comparative examples for explaining advantages of embodiments of the present disclosure.

DETAILED DESCRIPTIONS

Figure 1A:
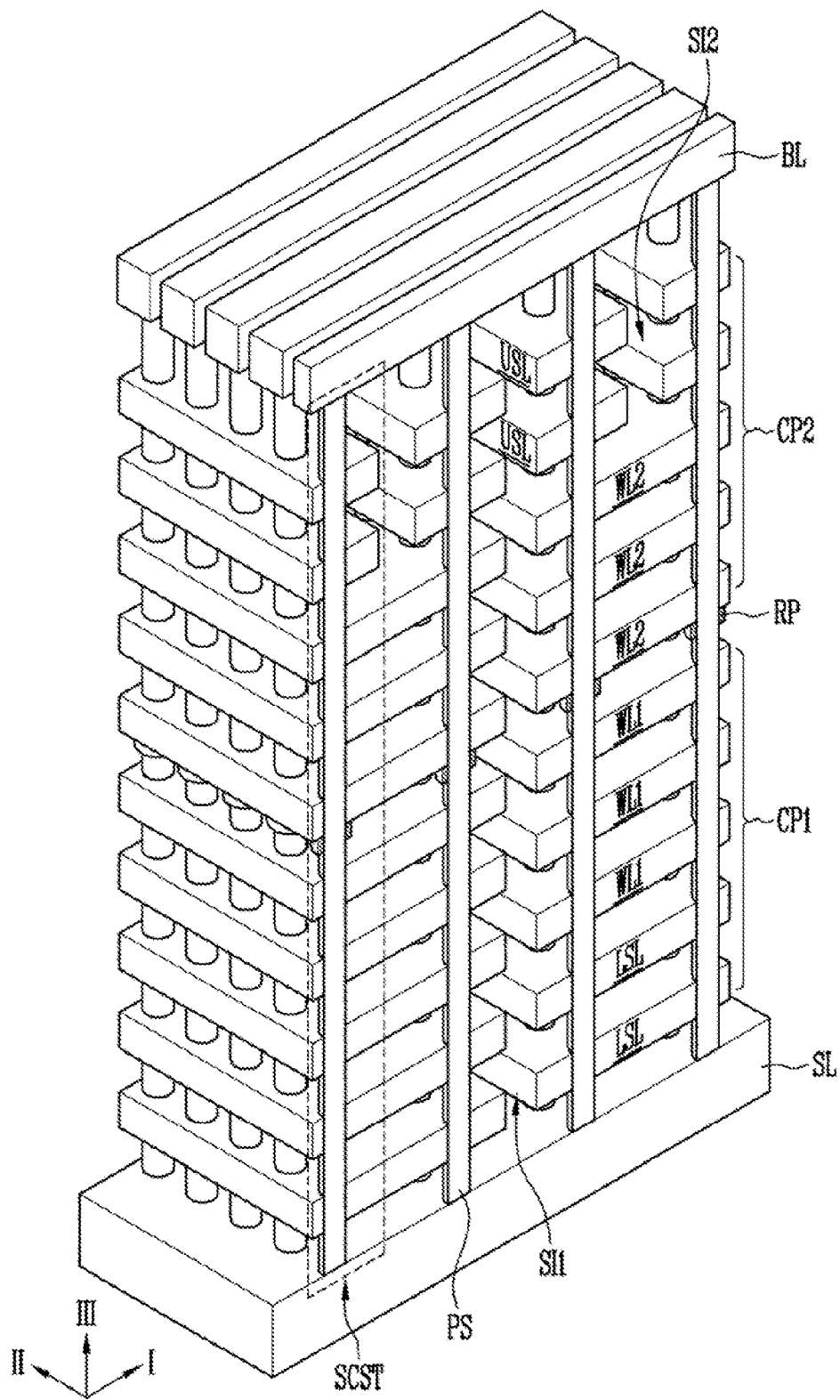

Various embodiments are illustrated in the accompanying drawings and described further below. It will be understood that the description herein is not intended to limit the invention to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", "including," "has" and/or "having" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

FIGS. 1A and 1B illustrate two different embodiments of a semiconductor device are provided. In FIGS. 1A and 1B, a pillar-structure is shown schematically, and insulating layers are not shown.

Referring to FIG. 1A, a semiconductor device, according to an embodiment of the present disclosure, may include a straight type cell string SCST. The straight type cell string SCST may include a pillar-structure PS extending in a vertical direction III, and conductive patterns CP1 and CP2 surrounding the pillar-structure PS. The conductive patterns CP1 and CP2 are spaced apart at regular intervals in a vertical direction III.

The pillar-structure PS may be disposed between and be electrically connected to a source layer SL and the bit line BL. The pillar-structure PS may pass vertically through the conductive patterns CP1 and CP2. The pillar-structure PS may include a channel layer disposed between and electrically connected to the source layer SL and the bit line BL. A multi-layers structure may be formed between the channel layer and each of the conductive patterns CP1 and CP2. The multi-layers structure may include a data storage layer. The multi-layers structure may further include a tunnel insulating layer between the data storage layer and the channel layer. The multi-layers structure may further include a blocking insulating layer between the data storage layer and each of the conductive patterns CP1 AND CP2. The pillar-structure PS may further include a core insulating layer surrounded with the channel layer.

The bit line BL may be coupled to a top of the pillar-structure PS, and the source layer SL may be coupled to a bottom of the pillar-structure PS. The source layer SL may be implemented as a portion of an impurities-doped semiconductor substrate, or as a separate doped silicon layer formed on a semiconductor substrate.

The conductive patterns CP1 and CP2 may be divided in a first stack of the first conductive patterns CP1 and a second stack of the second conductive patterns CP2. The second conductive patterns CP2 may be disposed above the first conductive patterns CP1. The first and second conductive patterns CP1 and CP2 may both be separated into two vertical stacks by a vertically extending first slit SI1.

The first conductive patterns CP1 may include a vertical series arrangement of a lower select line LSL and the first word lines WL1 along the pillar-structure PS. The lower select line LSL may be disposed between the first word lines WL1 and the source layer SL. The lower select line LSL between the first word lines WL1 and the source layer SL may be disposed in a single level or multiple levels. In the embodiment of FIG. 1A, the lower select line is shown disposed in two levels.

The second conductive patterns CP2 may include a vertical series arrangement of the second word lines WL2 and an upper select line USL along the pillar-structure PS. The upper select line USL may be disposed between the second word lines WL2 and the bit line BL. The upper select line USL between the second word lines WL2 and the bit line BL may be disposed in a single level or multiple levels. In the embodiment of FIG. 1A, the upper select line is shown disposed in two levels.

At least one of the lower select line LSL and the upper select line USL may be divided into sub-divisions, each sub-division being smaller than each of the first and the second word lines WL1 and WL2. For example, each of the first and the second word lines WL1 and WL2 may surround at least two columns of the pillar-structure PS, and a single sub-division of the upper select line USL may surround a single column of the pillar-structure PS. In this case, the upper select line USL may be divided by not only the first slit SI1, but also a second slit SI2. In this way, each sub-division of the upper select line USL may be smaller in a width than each of the first and the second word lines WL1 and WL2.

A ring pattern RP may be formed between the first conductive patterns CP1 and the second conductive patterns CP2. The ring pattern RP may surround the pillar-structure PS. The ring pattern RP may contact a lowest conductive pattern out of the second conductive patterns CP2, the lowest conductive pattern being adjacent to the first conductive patterns CP1. The ring pattern RP may suppress a fin-type groove formation in the first stack.

In the above-described configuration, each of the memory cells may be formed at each of the intersections between the pillar-structure PS including the channel layer and the first and the second word lines WL1 and WL2. A lower select transistor may be formed at an intersection between the pillar-structure PS including the channel layer and the lower select line LSL. An upper select transistor may be formed at an intersection between the pillar-structure PS including the channel layer and the upper select line USL. A series connection of the lower select transistor, the memory cells, and the upper select transistor along a single pillar-structure PS and via the channel layer therein may form a single straight type cell string SCST.

Referring to FIG. 1B, a semiconductor device, according to an embodiment of the present disclosure, may include a U type cell string UCST. The U type cell string UCST may include a U type through-structure UTHS, conductive patterns CP1 and CP2, and a pipe gate PG. The conductive patterns CP1 and CP2 surround the through-structure UTHS and are spaced apart at regular intervals in a vertical direction. The pipe gate PG is disposed under the conductive patterns CP1 and CP2 and surrounds the through-structure UTHS.

The through-structure UTHS may include a pipe through-structure P_THS embedded in the pipe gate PG, and at least two pillar-structures S_PS and D_PS extending vertically from the pipe through-structure P_THS. In order words, the pipe through-structure P_THS and the at least two pillar-structures S_PS and D_PS may be formed of a monolithic pattern. The pillar-structures S_PS and D_PS extending from the pipe through-structure P_THS may include a source side pillar-structure S_PS and a drain side pillar-structure D_PS. The through-structure UTHS may include a channel layer disposed between and electrically connected to a common source line CSL and a bit line BL. A multi-layers structure may be formed between the channel layer and each of the conductive patterns CP1 and CP2. The multi-layers structure may include a data storage layer. The multi-layers structure may further include a tunnel insulating layer between the data storage layer and the channel layer. The multi-layers structure may further include a blocking insulating layer between the data storage layer and each of the conductive patterns CP1 and CP2. The through-structure UTHS may further include a core insulating layer surrounded with the channel layer. The above-mentioned channel layer, multi-layers structure and core insulating layer may extend along the through-structure UTHS. In other words, the channel layer, the multi-layers structure and the core insulating layer may extend along the pillar-structures S_PS and D_PS and the pipe through-structure P_THS coupled thereto.

The channel layer in the through-structure UTHS may be disposed between and electrically connected to the common source line CSL and the bit line BL. The bit line BL and the common source line CSL may be disposed at different levels. For example, the common source line CSL may be disposed below the bit line BL. The bit line BL may be disposed above and electrically connected to a drain side channel layer formed in and along the drain side pillar-structure D_PS. A contact plug may be formed between the bit line BL and the drain side pillar-structure D_PS. The common source line CSL may be disposed above and electrically connected to a source side channel layer formed in and along the source side pillar-structure S_PS. A further contact plug may be formed between the common source line CSL and the source side pillar-structure S_PS.

The pipe gate PG may be disposed under the bit line BL, the common source line CSL, and the conductive patterns CP1 and CP2, and may surround the pipe through-structure P_THS.

The conductive patterns CP1 and CP2 may be divided into a first stack of the first conductive patterns CP1 and a second stack of the second conductive patterns CP2. The second conductive patterns CP2 may be disposed above the first conductive patterns CP1. The first and the second conductive patterns CP1 and CP2 may be disposed under the bit line BL and the common source line CSL.

The first conductive patterns CP1 may include the first source side conductive patterns CP1_S and the first drain side conductive patterns CP1_D separated from each other by a slit SI. The first source side conductive patterns CP1_S may surround the source side pillar-structure S_PS, and may be vertically arranged along the source side pillar-structure S_PS. The first source side conductive patterns CP1_S may respectively act as the first source side word lines WL1S.

The first drain side conductive patterns CP1_D may surround the drain side pillar-structure D_PS, and may be vertically arranged along the drain side pillar-structure D_PS. The first drain side conductive patterns CP1_D may respectively act as the first drain side word lines WL1D.

The second conductive patterns CP2 may include the second source side conductive patterns CP2_S and the second drain side conductive patterns CP2_D separated from each other by the slit SI. The second source side conductive patterns CP2_S may surround the source side pillar-structure S_PS, and may be vertically arranged along the source side pillar-structure S_PS. The second source side conductive patterns CP2_S may include the second source side word lines WL2S and a source select line SSL. The second source side word lines WL2S may be disposed between the common source line CSL and the first source side conductive patterns CP1_S. The source select line SSL may be disposed between the common source line CSL and the second source side word lines WL2S. The source select line SSL between the common source line CSL and the second source side word lines WL2S may be disposed at a single level or multiple levels. The second drain side conductive patterns CP2_D may surround the drain side pillar-structure D_PS, and may be vertically arranged along the drain side pillar-structure D_PS. The second drain side conductive patterns CP2_D may include the second drain side word lines WL2D and a drain select line DSL. The second drain side word lines WL2D may be disposed between the drain select line DSL and the first drain side conductive patterns CP1_D. The drain select line DSL may be disposed between the bit line BL and the second drain side word lines WL2D. The drain select line DSL between the bit line BL and the second drain side word lines WL2D may be disposed at a single level or multiple levels. In the embodiment of FIG. 1B, the drain select line DSL is disposed at two levels.

Ring patterns RP may be respectively formed between the first conductive patterns CP1 and the second conductive patterns CP2. The ring patterns RP may surround the source side pillar-structure PS_S and the drain side pillar-structure PS_D. The ring patterns RP may include a source side ring pattern RP_S surrounding the source side pillar-structure PS_S, and a drain side ring pattern RP_D surrounding the drain side pillar-structure PS_D. The source side ring pattern RP_S and the drain side ring pattern RP_D may contact the lowest conductive pattern out of the second conductive patterns CP2, the lowest conductive pattern being adjacent to the first conductive patterns CP1. More specifically, the source side ring pattern RP_S may contact the lowest second source side conductive pattern (word line) out of the second source side conductive patterns CP2_S, the lowest second source side conductive pattern being adjacent to the first source side conductive patterns CP1_S. The drain side ring pattern RP_D may contact the lowest second drain side conductive pattern (word line) out of the second drain side conductive patterns CP2_D, the lowest second drain side conductive pattern being adjacent to the first drain side conductive patterns CP1_D. The source side ring pattern RP_S and the drain side ring pattern RP_D may suppress a fin-type groove formation in the first stack.

In the above-described configuration, each of the source side memory cells may be formed at each of the Intersections between the source side pillar-structure PS_S including the channel layer and the first and the second source side word lines WL1S and WL2S. Each of the drain side memory cells may be formed at each of the intersections between the drain side pillar-structure PS_D including the channel layer and the first and the second drain side word lines WL1D and WL2D. A source select transistor may be formed at an intersection between the source side pillar-structure PS_S including the channel layer and the source select line SSL. A drain select transistor may be formed at an intersection between the drain side pillar-structure PS_D including the channel layer and the drain select line DSL. A pipe transistor may be formed at an intersection between the pipe through-structure P_THS including the channel layer and the pipe gate PG. A series connection of the source select transistor, the source side memory cells, the pipe transistor, the drain side memory cells, and the drain select transistor along a single U type through-structure UTHS and via the channel layer therein may form a single U type cell string UCST.

The through-structure UTHS may not be limited to the U type form as shown in FIG. 1B with respect to a form thereof, but may have a variety of forms including a W form. Although, in FIGS. 1A and 1B, the first and the second stacks are disposed under the bit line BL in way of example, the present disclosure may not be limited thereto. The present disclosure may be equally applied to a configuration with more than two stacks. The ring pattern RP may be formed at each of boundaries between the stacks. Hereinafter, for the sake of convenience of description, the semiconductor device with the first and the second stacks may be described by way of example.

Figure 2A:
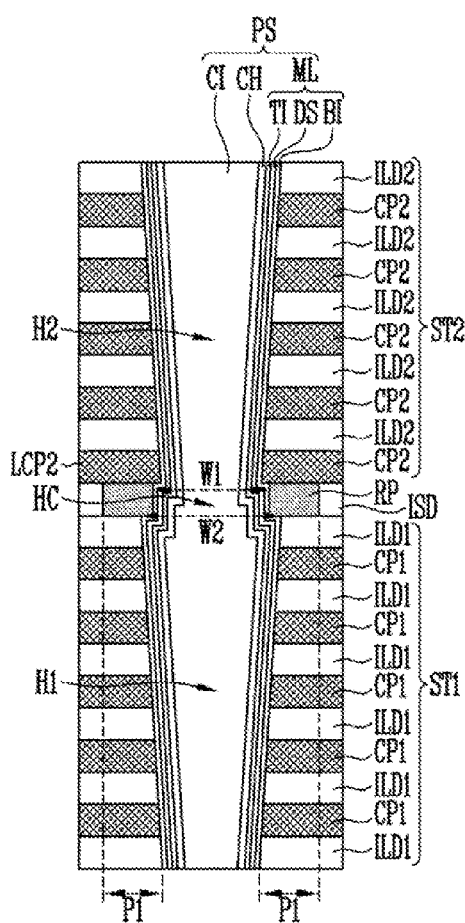
FIGS. 2A and 2B illustrate cross-sectional views of stacks having a pillar-structure passing through the stacks, according to embodiments of the present disclosure.
Figure 2B:
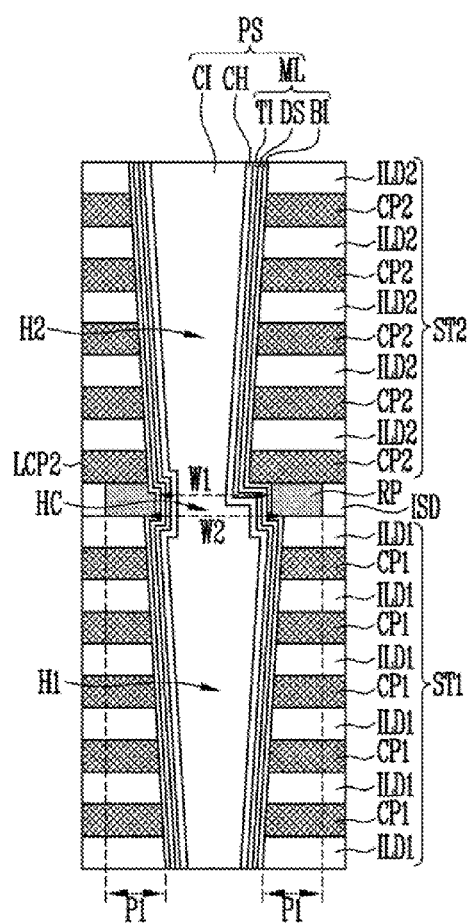

FIGS. 2A and 2B illustrate cross-sectional views of stacks and a pillar-structure passing through the stacks, according to embodiments of the present disclosure.

Referring to FIGS. 2A and 2B, stacks according to embodiments of the present disclosure may include first and second stacks ST1 and ST2. The second stack ST2 may be disposed above the first stack ST1.

The first stack ST1 may include vertical alternations of first interlayer insulating layers ILD1 and first conductive patterns CP1. The first stack ST1 may be passed vertically through by a first hole H1.

The second stack ST2 may include vertical alternations of second interlayer insulating layers ILD2 and second conductive patterns CP2. The second stack ST2 may be passed vertically through by a second hole H2.

A ring pattern RP may be disposed between the first stack ST1 and the second stack ST2. The ring pattern RP may pass vertically through an inter-stack insulating layer ISD between the first stack ST1 and the second stack ST2. An inner wall of the ring pattern RP may define a center hole HC in the inter-stack insulating layer ISD. The center hole HC may be coupled to the first hole H1 and the second hole H2.

The ring pattern RP may contact the lowest conductive pattern LCP2 out of the second conductive patterns CP2, the lowest conductive pattern LCP2 being adjacent to the first stack ST1. The ring pattern RP may be made of a different material from a material of the second interlayer insulating layers ILD2 in order to suppress a fin-type groove formation in the first stack ST1 during an etch process to form the second hole H2. More specifically, the ring pattern RP may be made of a material with a different etch selectivity from an etch selectivity of a material of the second interlayer insulating layers ILD2. For example, the ring pattern RP may be made of Ti or TIN.

The center hole HC defined by the ring pattern RP may have a first width or diameter W1. The first width W1 may be equal to or smaller than a second width W2 of a topmost region of the first hole H1. When the first width W1 may be equal to or smaller than the second width W2, the first stack ST1 may be screened, i.e., isolated from above by the ring pattern RP. In other words, the first stack ST1 may not be exposed from above through the center hole HC of the ring pattern RP. Thus, during an etch process to form the second hole H2, a fin-type groove formation in the first stack ST1 which may otherwise occur through the center hole HC may be suppressed.

The ring pattern RP may have a controlled width such that a portion P1 of the first stack ST1 around the first hole H1 may be screened from above, or in other words, be out of a line-of-sight from the above. In this way, during an etch process to form the second hole H2, the ring pattern RP may serve as an etch stop layer to protect the first stack ST1 from the etching. This may lead to a suppression of a fin-type groove formation in the first stack ST1.

The width of the ring pattern RP is set with taking into account of an alignment margin of the second hole H2 such that an edge of a lowest portion of the second hole H2 may overlap the ring pattern RP. In other words, in an embodiment of the present disclosure, by controlling the width of the ring pattern RP, the second hole H2 may be positioned only within the ring pattern RP region. Such a positioning of the second hole H2 relative to the ring pattern RP according to the embodiment of the present disclosure may allow the first stack ST1 to be protected by the ring pattern RP from an etching process to form the second hole H2. This may lead to a suppression of a fin-type groove formation in the first stack ST1.

In one embodiment, the first and second holes H1 and H2 may be co-axial as shown in FIG. 2A. In another embodiment, the first hole H1 and the second hole H2 may not be co-axial as shown in FIG. 2B.

The pillar-structure PS may extend along a connection of the second hole H2, the center hole HC, and the first hole H1. The pillar-structure PS may include a channel layer CH, and a multi-layers structure ML as described above with reference to FIGS. 1A and 1B. The multi-layers structure ML may include at least one of a blocking insulating layer BI, a tunnel insulating layer TI, and a data storage layer DS. The data storage layer DS may surround an outer wall of the channel layer CH. The tunnel insulating layer TI may be disposed between the channel layer CH and the data storage layer DS. The blocking insulating layer BI may surround an outer wall of the data storage layer DS.

The tunnel insulating layer TI and the blocking insulating layer BI may be made of silicon oxide. The data storage layer DS may be made of silicon nitride with a charge trap ability. The blocking insulating layer BI may be formed of an insulating layer with a higher dielectric constant than silicon oxide. The blocking insulating layer BI may be formed of a multi-layer dielectric film including the silicon oxide and the insulating layer with a higher dielectric constant than the silicon oxide.

The channel layer CH may have a tube form with a hollow portion formed therein. In this case, the pillar-structure PS may further include a core insulating layer CI filling the hollow portion of the channel layer CH. The channel layer CH may be made of a semiconductor such as silicon. However, the invention is not limited in this way. For example, the channel layer CH may have a solid rod form without a hollow portion formed therein.

FIG. 3 illustrates a connection of a pillar-structure and a ring pattern. Referring to FIG. 3, the pillar-structure PS may include a core insulating layer CI, a channel layer CH surrounding the core insulating layer CI, and a multi-layers structure ML surrounding the channel layer CH. The multi-layers structure ML may include a tunnel insulating layer TI surrounding the channel layer CH, a data storage layer DS surrounding the tunnel insulating layer TI, and a blocking insulating layer BI surrounding the data storage layer DS. The pillar-structure PS may be partially surrounded with the ring pattern RP. The portion of the pillar-structure PS surrounded with the ring pattern RP may have a stepped cross-section as shown in FIGS. 2A and 2B FIGS. 4A and 4B illustrate comparative examples for explaining an effect according to an embodiment of the present disclosure. More specifically, FIG. 4A illustrates a comparative example where a ring pattern is not formed. FIG. 4B illustrates a comparative example where a width of a center hole defined by a ring pattern is larger than a width of a topmost portion of a first hole (lower hole).

Referring to FIG. 4A, a second stack ST2' passed vertically through by a second hole H2' may be disposed above the first stack ST1' passed vertically through by a first hole H1'. When the first hole H1' and the second hole H2' are not co-axial, a fin-type groove FH may be formed. The fin-type groove FH may result from a partial etching of the first stack ST1' through a portion of the second hole H2' not overlapping the first hole H1' during an etching process to form the second hole H2'. When the fin-type groove FH has an elongate shape, a channel layer CH' and a multi-layers structure ML' may combine together in the fin-type groove FH during formation of the channel layer CH' and the multi-layers structure ML' along inner faces of the first hole H1' and the second hole H2'. In this case, each of the channel layer CH' and the multi-layers structure ML' may have a discontinuity along and on the inner faces of the first hole H1' and the second hole H2', as shown in the encircled region indicated by reference character "A" in FIG. 4A. This discontinuity may lead to an operation failure such as an erase fail for the memory device.

By contrast, according to an embodiment of the present disclosure, a ring pattern RP may suppress the fin-type groove formation in the first stack, and, hence, the memory device may have a reliable operation.

Referring to FIG. 4B, a first width W1" of a center hole HC" defined by a ring pattern RP" coupled to a first hole H1" and a second hole H2" may be larger than a second width W2" of a topmost portion of the first hole H1". In this case, a connection of the first hole H1", the center hole HC" and the second hole H2" may have a C-shaped protrusion C toward an outer wall of the pillar structure. When the C-shaped protrusion C has a small thickness D", a channel layer and a multi-layers structure may combine together in the C-shaped protrusion C during formation of the channel layer and the multi-layers structure along and on an inner face of the C-shaped protrusion C. To avoid the combining together of the channel layer and the multi-layers structure in the C-shaped protrusion C, the ring pattern RP" according to an embodiment of the invention has a sufficiently large thickness D" so that the first width W1" is larger than the second width W2".

Hence, according to an embodiment of the present disclosure, the width of the center hole defined by the ring pattern is equal to or smaller than the width of the topmost portion of the first hole. This may lead to a suppression of the C-shaped protrusion C formation shown in FIG. 4B. Thus, the thickness of the ring pattern employed according to an embodiment of the present disclosure may be smaller than that of the ring pattern RP" as shown in the comparison example of FIG. 4B. This may allow stacking more interlayer insulating layers and conductive patterns using two vertical holes one on top of the other without encountering the problems associated with the prior art. Hence, this may be translated to a thinner or smaller semiconductor device according to an embodiment of the present disclosure.

Referring now to FIGS. 5A to 5E a method for manufacturing a semiconductor device is provided, according to an embodiment of the present disclosure. The method for manufacturing a semiconductor device, as shown in FIGS. 5A to 5E may be employed to form the semiconductor device as shown in FIG. 1A.

Figure 5A:
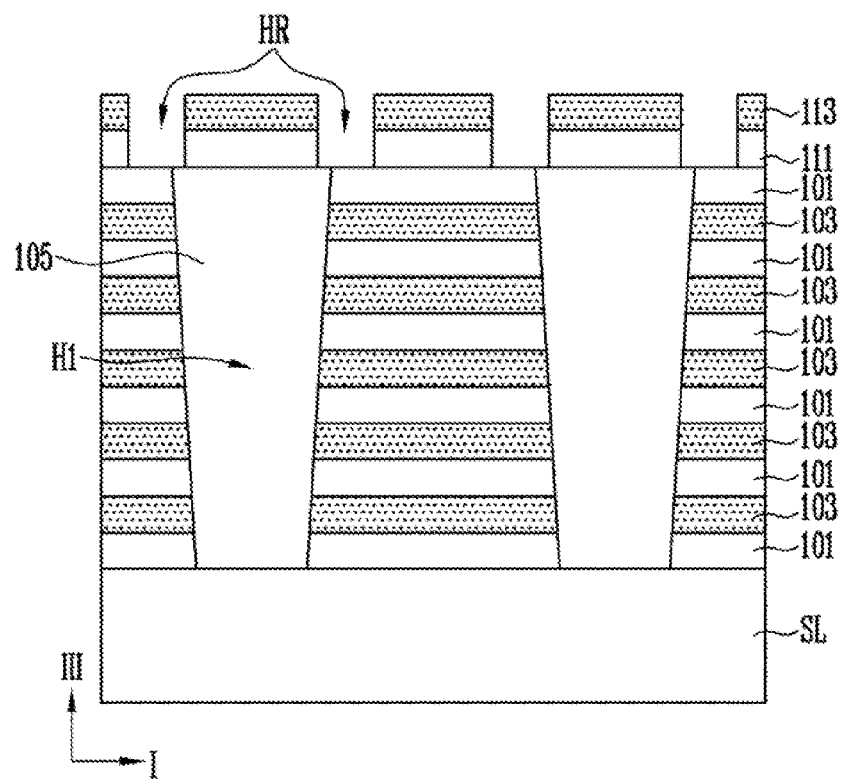
FIGS. 5A to 5E illustrate cross-sectional views of various stages of a method for manufacturing of a semiconductor device, according to an embodiment of the present disclosure.

Referring to FIG. 5A, a plurality of first and second material layers 101 and 103 are stacked on top of a source layer SL in an alternating manner along a vertical direction III. The source layer SL may be formed, for example, by doping impurities into a semiconductor substrate or patterning a conductive layer. The source layer SL may include a doped silicon layer.

The first and second material layers 101 and 103 may be made of different materials. For example, the first material layers 101 may be made of an insulating material suitable for an interlayer insulating layer, and the second material layers 103 may be made of a conductive material suitable for a conductive pattern. In an embodiment, the first material layers 101 may be made of silicon oxide, whereas the second material layers 103 may include at least one of a doped silicon layer, a metal silicide layer, and a metal layer. In another embodiment, the first material layers 101 may be made of an insulating material suitable for an interlayer insulating layer, whereas the second material layers 103 may be made of a sacrificial insulating material having a different etching selectivity from an etching selectivity of the first material layers 101. For example, the first material layers 101 may be made of a silicon oxide, whereas the second material layers 103 may be made of a nitride. When both of the first and second material layers 101 and 103 are made of insulating materials, etching processes which are employed subsequently for forming the first and second holes H1 and H2 and a slit SI may be performed more reliably and/or easier.

In yet another embodiment, the second material layers 103 may be made of a conductive material suitable for a conductive pattern, whereas the first material layers 101 may be made of a sacrificial conductive material having a different etching selectivity from an etching selectivity of the second material layers 103. For example, the first material layers 101 may be made of un-doped silicon, whereas the second material layers 103 may be made of doped silicon. When both of the first and second material layers 101 and 103 are made of conductive materials, the etching processes employed subsequently for forming the first and second holes H1 and the slit SI may be performed more reliably and or easier.

After, the first material layers 101 and the second material layers 103 may be passed through vertically by first holes H1. The first holes H1 may partially expose the source layer SL. Thereafter, each of the first holes H1 may be filled with through-sacrificial layers 105. Each of the through-sacrificial layers 105 may be made of a material having a different etching selectivity from an etching selectivity of the first and the second material layers 101 and 103. Further, the material of each of the through-sacrificial layers 105 may have a different etching selectivity from an etching selectivity of a ring pattern, which will be formed later. For example, each of the through-sacrificial layers 105 may be made of polysilazane (PSZ).

Thereafter, an inter-stack insulating layer 111 may be formed on the first material layers 101 and the second material layers 103 to cover the through-sacrificial layers 105. The inter-stack insulating layer 111 may be made of an oxide. Next, a mask pattern 113 may be formed on the inter-stack insulating layer 111. The inter-stack insulating layer 111 may be etched partially by an etching process employing the mask pattern 113 as an etching barrier. For example, ring-type holes HR may be formed in the inter-stack insulating layer 111. Each of the ring type holes HR may overlap an edge of each of the first holes H1.

Figure 5B:
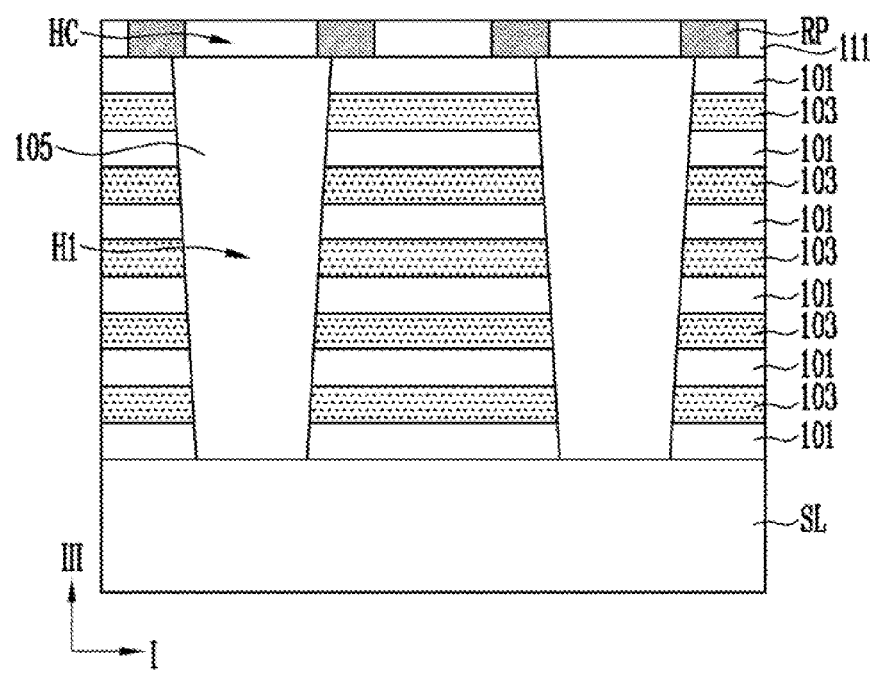

Referring to FIG. 5B, a material layer for ring patterns RP may be applied to completely fill the ring type holes HR, and, then, the material layer for the ring patterns RP may be subjected to a planarization such as a chemical mechanical polishing (CMP). At this time, the mask pattern 113 may be removed. In this way, the ring patterns RP may be respectively formed in the ring type holes HR.

The ring patterns RP may be made of a material having a different etching selectivity from an etching selectivity of third material layers and fourth material layers, which will be formed later. For example, the ring patterns RP may be made of Ti or TiN.

An inner wall of each of the ring patterns RP may extend above the first hole H1 to define a center hole HC positioned above the first hole H1, the center hole HC having a width or diameter that is equal or smaller than the width of the first hole H1. The inter-stack insulating layer 111 may remain in the center hole HC. In an embodiment a diameter or width of the center hole HC may smaller than a diameter or width of a topmost portion of the first hole H1.

Figure 5C:
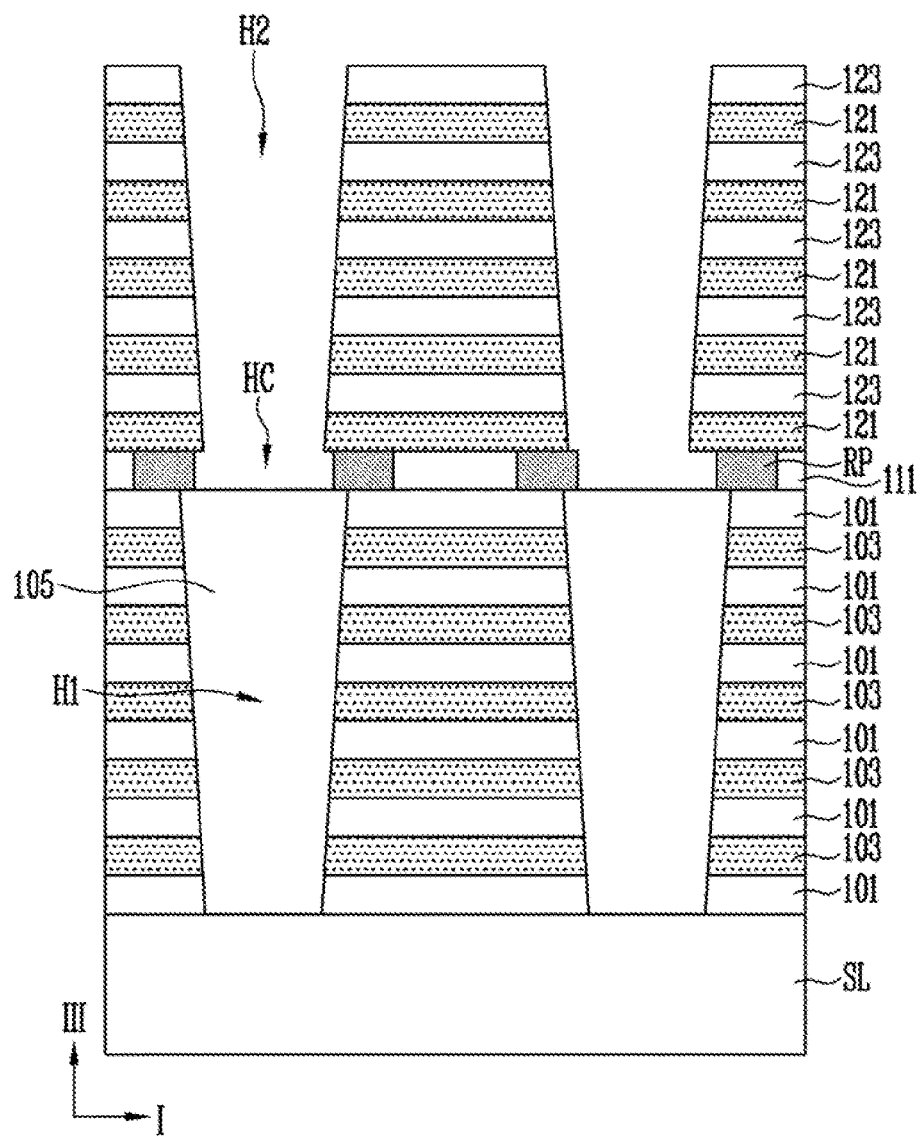

Referring to FIG. 5C, third and fourth material layers 121 and 123 may be alternately stacked along the vertical direction III on top of the inter-stack insulating layer 111. The inter-stack insulating layer 111 may be passed through vertically by the ring patterns RP. The third material layers 121 may be made of the same material as the second material layers 103. The fourth material layers 123 may be made of the same material as the first material layers 101.

Subsequently, the third and fourth material layers 121 and 123 may be etched partially in the vertical direction III for forming vertical second holes H2 passing through the third and fourth material layers 121 and 123. During the etching process for forming the second holes H2, the inter-stack insulating layer 111 remaining in the center holes HC may be removed to open the center holes HC. Thus, the through-sacrificial layer 105 may be exposed through each of the second holes H2.

During formation of the second holes H2, the second holes H2 and the first holes H1 may or may not be co-axial. If the second holes H2 and the first holes H1 are not co-axial, a width of each of the ring patterns RP may be controlled such that an edge of each of the second holes H2 may overlap an edge of the ring patterns RP corresponding thereto.

In the present disclosure, during the etching process to form the second holes H2, each of the ring patterns RP may act as an etch stop layer. During etching the third and the fourth material layers 121 and 123, the ring patterns RP may screen the first and the second material layers 101 and 103 from above. Thus, a fin-type groove formation in the first and second material layers 101 and 102 may be suppressed.

Figure 5D:
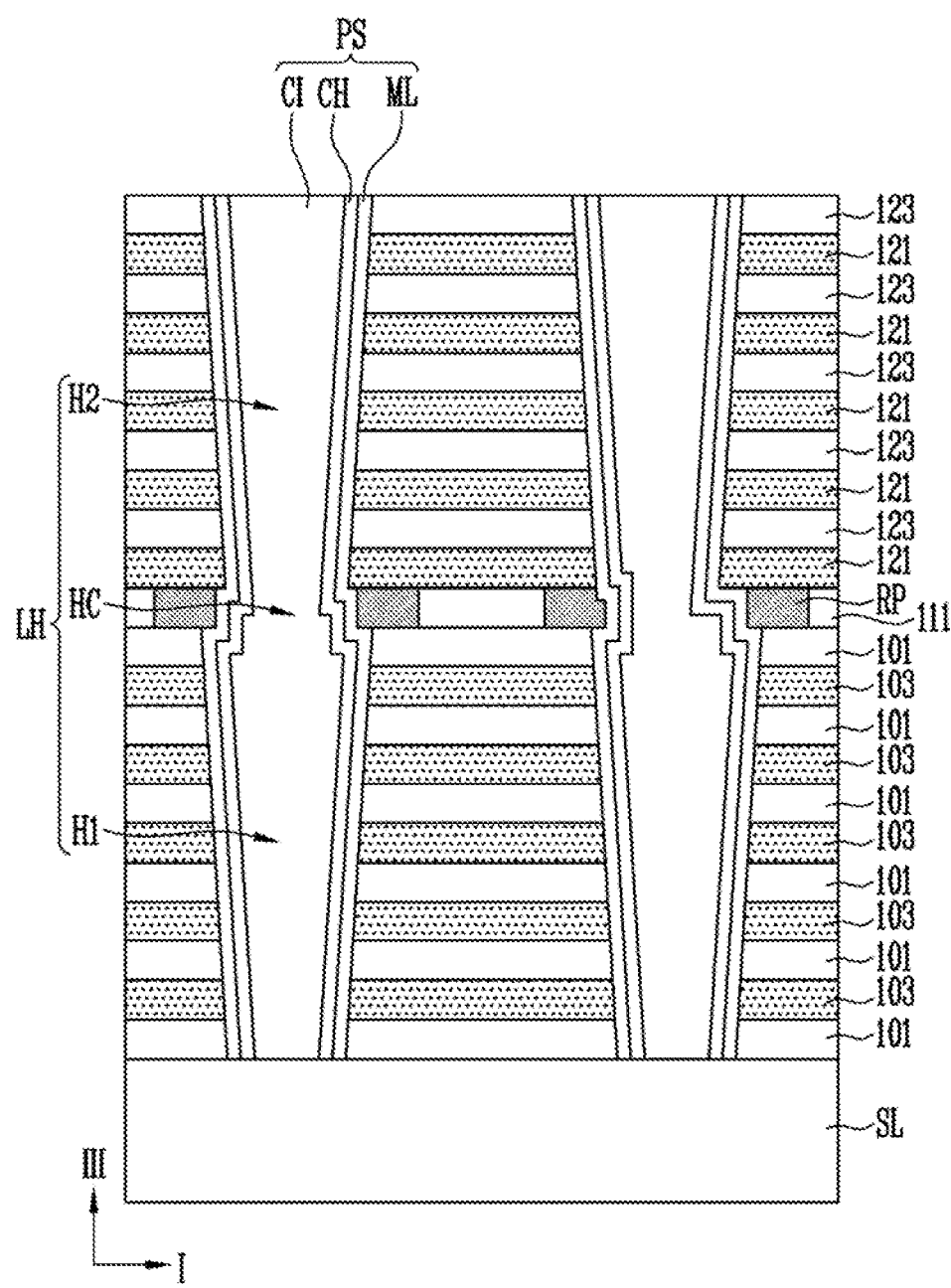

Referring to FIG. 5D, the through-sacrificial layers 105 may be removed through the second holes H2 to open the first holes H1. Thus, a connection of one of the second holes H2, one of the center holes HC, and one of the first holes H1 may form a hole connection LH. The hole connection LH may partially expose the source layer SL. A plurality of the hole connections LH may be formed.

Then, within each of the hole connections LH, each of pillar-structures PS may be formed. Each of the pillar-structures PS may include a multi-layers structure ML and a channel layer CH formed to conform to an inner face of the hole connection LH. The multi-layers structure ML may include a blocking insulating layer, a data storage layer, and a tunnel insulating layer as described above with reference to FIG. 2A to FIG. 3. In the present disclosure, the fin-type groove may not be formed, and, hence, a discontinuity of each of the multi-layers structure ML and the channel layer CH may be avoided. When the channel layer CH has a tube form, the pillar-structure PS may further include a core insulating layer CI filling a hollow portion of the tubular channel layer CH.

Figure 5E:
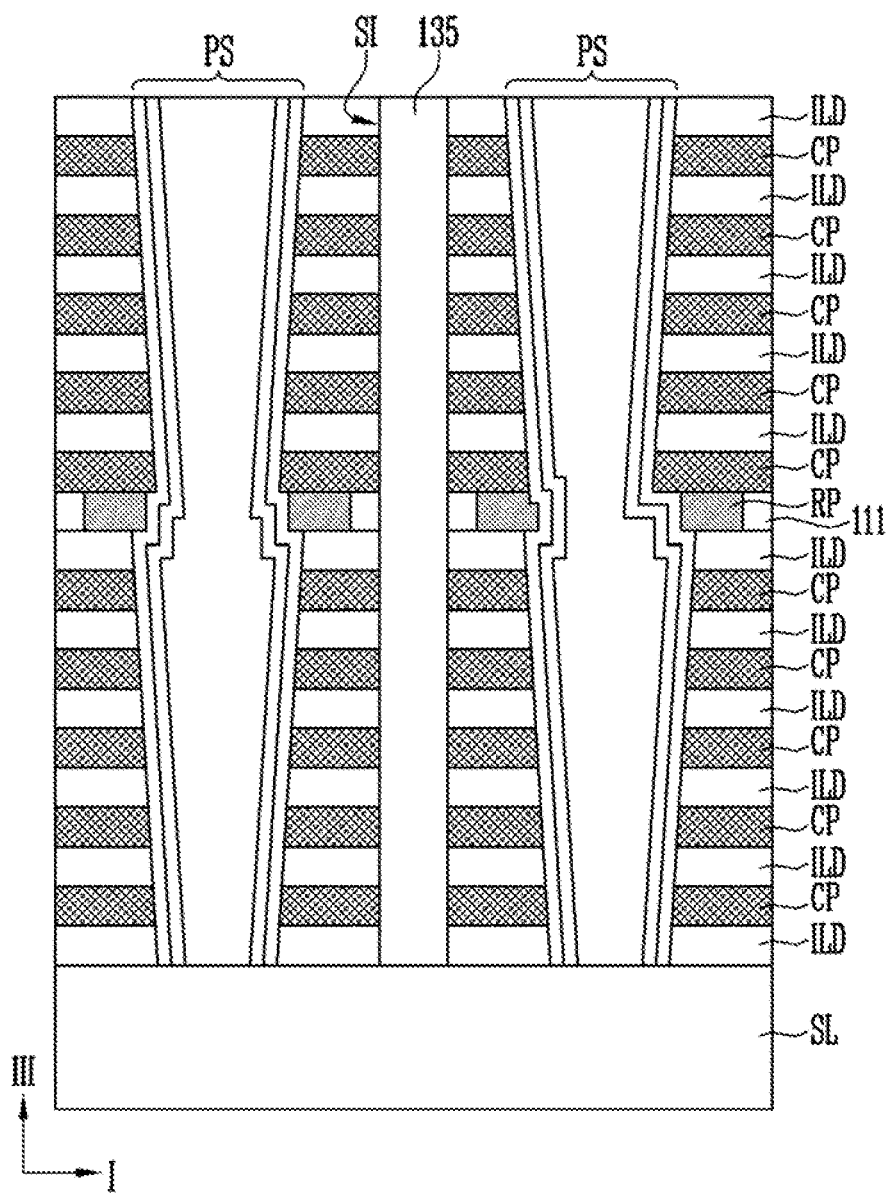

Referring to FIG. 5E, the first to fourth material layers 101, 103, 121, and 123 may be partially vertically etched between neighboring pillar-structures PS to form a slit SI passing vertically through the first to fourth material layers 101, 103, 121, and 123. The slit SI may be disposed between neighboring ring patterns RP. In an embodiment of the present disclosure, since each of the ring patterns RP may be formed to surround each of the pillar-structures PS, the forming of the slit SI may dispense with a separate etch process to remove the material layers for the ring patterns RP. To the contrary, when each of the material layers for the ring patterns RP is not formed in a ring shape, but is formed on an entire top region of the stack of the first and second material layers 101 and 103, forming of the slit SI may be made using a separate etch process for removing the material layers for the ring patterns RP. According to an embodiment of the present disclosure, each of the material layers acting as an etch stop layer may be formed not in a planar pattern but in a ring pattern RP, hence, facilitating the slit SI formation.

When the first and fourth material layers 101 and 123 are made of an insulating material suitable for an interlayer insulating layer, and the second and the third material layers 103 and 121 are made of a conductive material suitable for a conductive pattern, the first material layers 101 and the fourth material layers 123 may be divided into the interlayer insulating layers ILD by the slit SI. Further, the second material layers 103 and the third material layers 121 may be divided into the conductive patterns CP by the slit SI.

According to a variation of the above embodiment, when the first and fourth material layers 101 and 123 are made of an insulating material suitable for an Interlayer insulating layer, and the second and third material layers 103 and 121 are made of a sacrificial insulating material, the first material layers 101 and the fourth material layers 123 may be divided into the interlayer insulating layers ILD by the slit SI. Further, the second material layers 103 and the third material layers 121 may be replaced with the conductive patterns CP through the slit SI.

In yet another variation, when the first and fourth material layers 101 and 123 are made of a sacrificial conductive material, and the second and third material layers 103 and 121 are made of a conductive material for a conductive pattern, the second material layers 103 and the third material layers 121 may be divided into the conductive patterns CP by the slit SI. Further, the first material layers 101 and the fourth material layers 123 may be replaced with the interlayer insulating layers ILD through the slit SI.

After this, the slit SI may be filled with a slit insulating layer 135.

Figure 6A:
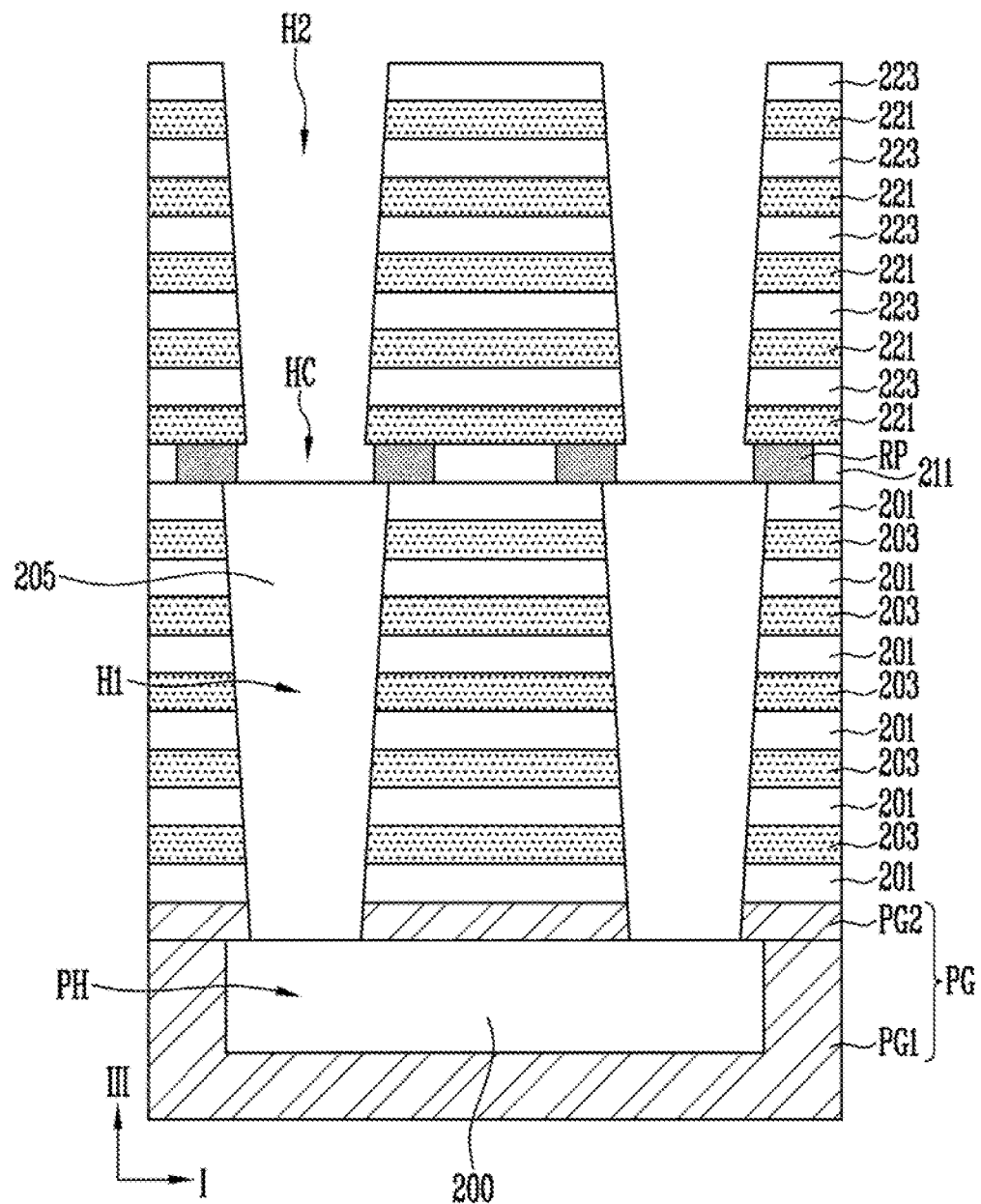
FIGS. 6A and 6B illustrate cross-sectional views of various stages of a method for manufacturing of a semiconductor device, according to another embodiment of the present disclosure.
Figure 6B:
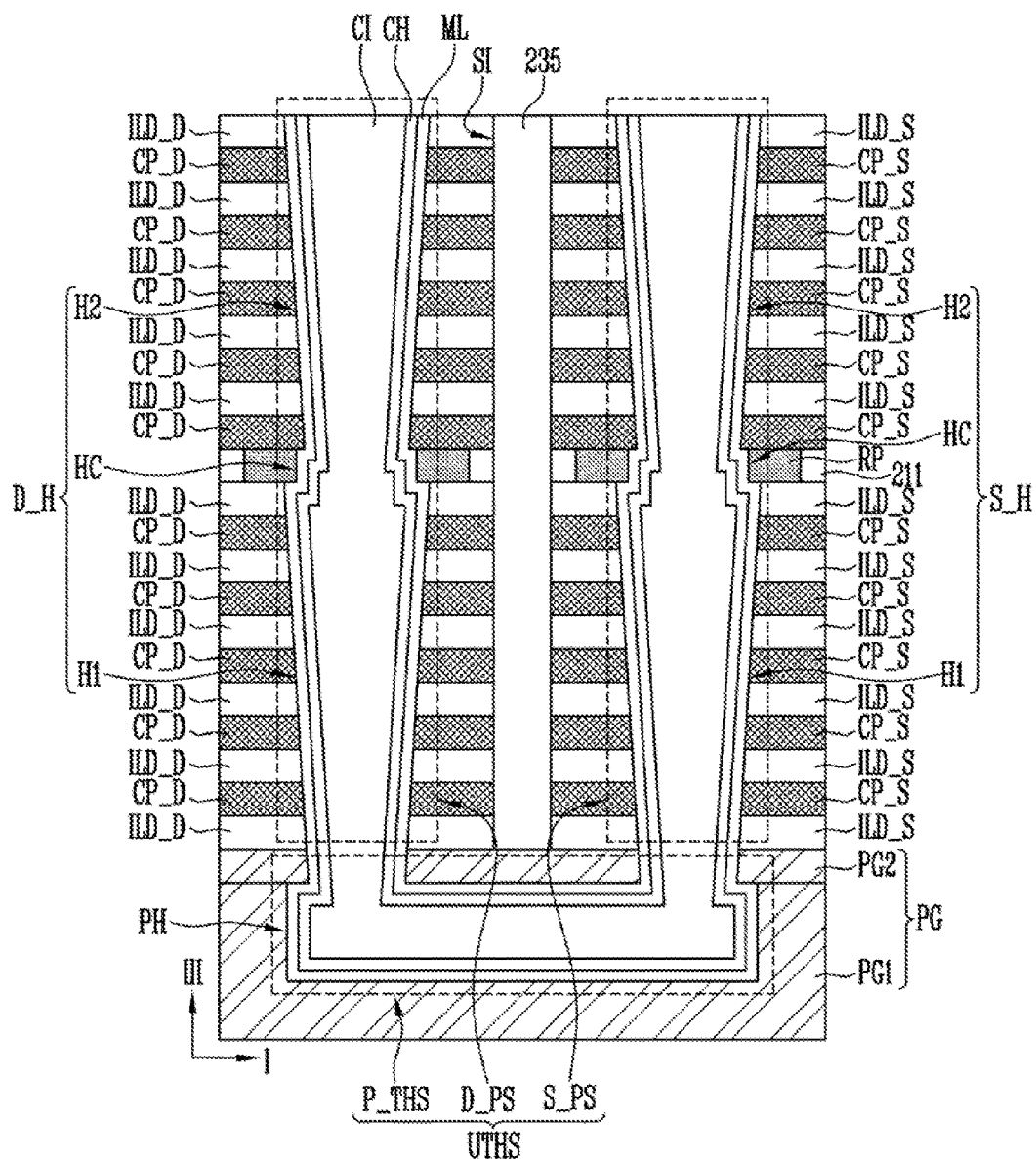

FIGS. 6A and 6B illustrate cross-sectional views of various stages of a method for manufacturing a semiconductor device according to an embodiment of the present disclosure. Although, for the sake of convenience of description, the first and second holes are shown to be co-axial in FIGS. 6A and 6B by way of example, the present disclosure is not limited thereto. In other words, the present disclosure may include an embodiment where the first and second holes are not co-axial. The method for manufacturing a semiconductor device, as shown in FIGS. 6A to 6B may be employed to form the semiconductor device as shown in FIG. 1B.

Referring to FIG. 6A, a pipe gate PG may be provided having embedded therein a pipe sacrificial layer 200 filling a pipe hole PH formed in the pipe gate PG. This pipe gate PG formation may include first partially etching a first sub-pipe gate PG1 to form the pipe hole PH therein, then filling the pipe hole PH with the pipe sacrificial layer 200, followed by forming a second sub-pipe gate PG2 on the first sub-pipe gate PG1.

The first and second sub-pipe gates PG1 and PG2 may be made of a conductive material. For example, the first and second sub-pipe gates PG1 and PG2 may be made of silicon.

Subsequently, the first and second material layers 201, and 203 may be stacked in an alternating manner on top of the pipe gate PG having embedded therein the pipe sacrificial layer 200. The first and the second material layers 201 and 203 may be made of the same materials as the first and second material layers 101 and 103, respectively, in a same manner as described above with reference to FIG. 5A.

Thereafter, the first and second material layers 201 and 203 may be passed through partially by first holes H1 extending in a vertical direction III. Further, the first holes H1 may also pass through partially the second pipe gate PG2 exposing the pipe sacrificial layer 200. The pipe sacrificial layer 200 may be exposed by at least two first holes H1.

Subsequently, each of the first holes H1 may be filled with each of the through-sacrificial layers 205. The through-sacrificial layers 205 may be made of the same material as the through-sacrificial layers 105, as described above with reference to FIG. 5A.

Next, an inter-stack insulating layer 211 partially vertically passed through by ring patterns RP may be formed on the stack of the first material layers 201 and the second material layers 203 using the same process as described above with reference to FIG. 5A and FIG. 5B. An inner wall of each of the ring patterns RP may define a center hole HC.

Then, third material layers 221 and fourth material layers 223 may be alternately stacked on the inter-stack insulating layer 211 partially and vertically passed through by the ring patterns RP. The third material layers 221 may be made of the same material as the second material layers 203. The fourth material layers 223 may be made of the same material as the first material layers 201.

Thereafter, second holes H2 which may partially and vertically pass through the third and the fourth material layers 221 and 223 for exposing the through-sacrificial layers 205 may be formed using the same process as described above with reference to FIG. 5C. During formation of the second holes H2, the ring patterns RP may serve as an etch stop layer, and, hence, the ring patterns RP may allow the first and second material layers 201 and 203 to be screened from above. This may lead to a suppression of the fin-type groove formation in the first and the second material layers 201 and 203.

Referring to FIG. 6B, the through-sacrificial layers 205 may be respectively removed through the second holes H2 to open the pipe sacrificial layer 200. Then, the pipe sacrificial layer 200 may be removed. Thus, by connecting a pipe hole PH, a source side hole S_H coupled to one end of the pipe hole PH, and a drain side hole D_H coupled to the other end of the pipe hole PH, a single U-shaped hole may be formed.

The source side hole S_H may include a single first hole H1 coupled to an end of the pipe hole PH, a single center hole HC, and a single second hole H2. The drain side hole D_H may include a single first hole H1 coupled to the other end of the pipe hole PH, a single center hole HC, and a single second hole H2.

Thereafter, a U type through-structure UTHS may be formed in the U-shaped hole. The U type through-structure UTHS may include a source side pillar-structure S_PS formed in the source side hole S_H, a drain side pillar-structure D_PS formed in the drain side hole D_H, and a pipe through-structure P_THS formed in the pipe hole PH and connecting the source side pillar-structure S_PS with the drain side pillar-structure D_PS.

The source side pillar-structure S_PS, the drain side pillar-structure D_PS and the pipe through-structure P_THS may form a monolithic U type through-structure UTHS and, thus, may be made of the same material.

The U type through-structure UTHS may include a multi-layers structure ML and a channel layer CH formed to conform to an inner face of the U type hole.

The multi-layers structure ML may include a blocking insulating layer, a data storage layer, and a tunnel insulating layer as described above with reference to FIG. 2A to FIG. 3. In an embodiment of the present disclosure, the fin-type groove may not be formed, and, hence, a discontinuity of each of the multi-layers structure ML and the channel layer CH may be avoided. When the channel layer CH has a tube form, the U type through-structure UTHS may further include a core insulating layer CI filling a hollow portion of the tubular channel layer CH.

Then, the first to fourth material layers 201, 203, 221, and 223 may be partially and vertically etched between the source side pillar-structure S_PS and the drain side pillar-structure D_PS to form a slit SI passing there-through. The slit SI may be disposed between adjacent ring patterns RP. In the present disclosure, since each of the ring patterns RP may be formed to surround the source side pillar-structure S_PS and the drain side pillar-structure D_PS, the forming of the slit SI may dispense with a separate etch process to remove the material layers for the ring patterns RP. To the contrary, when each of the material layers for the ring patterns RP is not formed in a ring shape, but is formed on an entire top region of the stack of the first and second material layers 201 and 203, the forming of the slit SI needs a separate etch process to remove the material layers for the ring patterns RP. Hence, according to an embodiment of the present disclosure, each of the material layers acting as an etch stop layer may be formed not in a planar pattern but in the ring patterns RP, and, hence, the slit SI formation may be simplified.

In an embodiment, the first and the fourth material layers 201 and 223 are made of an insulating material suitable for an interlayer insulating layer, and the second and third material layers 203 and 221 are made of a conductive material suitable for a conductive pattern. The first and the fourth material layers 201 and 223 may be divided into the source side interlayer insulating layers ILD_S and the drain side interlayer insulating layers ILD_D by the slit SI. Further, the second and the third material layers 203 and 221 may be divided into the source side conductive patterns CP_S and the drain side conductive patterns CP_D by the slit SI.

In another embodiment, when the first and the fourth material layers 201 and 223 are made of an insulating material suitable for an interlayer insulating layer, and the second and the third material layers 203 and 221 are made of a sacrificial insulating material, the first and the fourth material layers 201 and 223 may be divided into the source side interlayer insulating layers ILD_S and the drain side interlayer insulating layers ILD_D by the slit SI. Further, the second material layers 203 and the third material layers 221 may be replaced with the conductive patterns CP_S, and CP_D through the slit SI. The conductive patterns CP_S, and CP_D may include the source side conductive patterns CP_S surrounding the source side pillar-structure S_PS, and the drain side conductive patterns CP_D surrounding the drain side pillar-structure D_PS.

In a further embodiment, when the first and the fourth material layers 201 and 223 are made of a sacrificial conductive material, and the second and third material layers 203 and 221 are made of a conductive material suitable for a conductive pattern, the second and the third material layers 203 and 221 may be divided into the source side conductive patterns CP_S and the drain side conductive patterns CP_D by the slit SI. Further, the first and fourth material layers 201 and 223 may be replaced with the interlayer insulating layers ILD_S, and ILD_D through the slit SI. The interlayer insulating layers ILD_S, and ILD_D may include the source side interlayer insulating layers ILD_S surrounding the source side pillar-structure S_PS, and the drain side interlayer insulating layers ILD_D surrounding the drain side pillar-structure D_PS.

After this, the slit SI may be filled with a slit insulating layer 235.

In an embodiment of the present disclosure, the ring pattern may be disposed between the first stack and the second stack. The ring pattern may protect the first stack from the etching process of the second stack above the ring pattern to form the hole. This may lead to a suppression of the fin-type groove formation in the first stack, and, hence, it may lead to an improved operation reliability and process reproductive rate of the semiconductor device.

Figure 7:
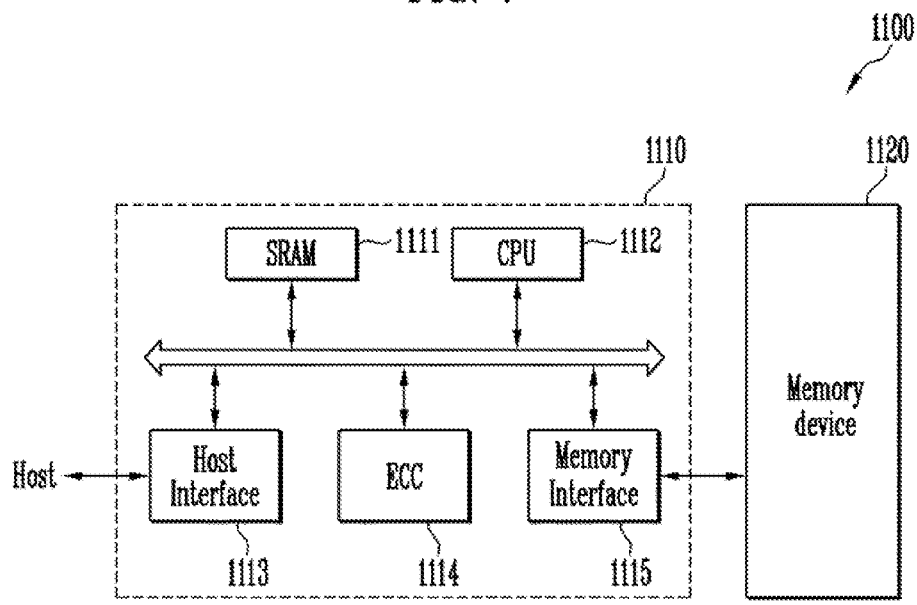
FIG. 7 illustrates a block diagram of a memory system, according to an embodiment of the present disclosure.

Referring to FIG. 7 a memory system 1100 is provided, according to an embodiment of the present disclosure. The memory system 1100 may include a semiconductor memory device 1120 and a memory controller 1110.

The semiconductor memory device 1120 may be configured as illustrated above in connection to FIGS. 1A to 6B. In an embodiment, the semiconductor device 1120 may comprise a first stack including vertically alternating first interlayer insulating layers and first conductive patterns; a second stack including vertically alternating second interlayer insulating layers and second conductive patterns, the second stack being above the first stack; pillar-structures passing through the first and second stacks; and ring patterns disposed between the first and second stacks, each ring pattern surrounding each pillar-structure. Further, the memory device 1120 may be implemented as a multi-chip package including a plurality of flash memory chips.

The memory controller 1110 may be configured to control the memory device 1120. The memory controller 1110 may include a static random access memory (SRAM) 1111, a central processing unit (CPU) 1112, a host interface 1113, an error correction code (ECC) unit 1114, and a memory interface 1115. The SRAM 1111 may act as a work memory for the CPU 1112. The CPU 1112 may control all operations for data exchange of the memory controller 1110. The host interface 1113 may have a data exchange protocol between the memory system 1100 and a host system (not shown) coupled to the memory system 1100. Further, the ECC unit 1114 may detect and correct an error in data read from the memory device 1120, and the memory interface 1115 may interface the memory device 1120. In addition, the memory controller 1110 may include a read only memory (ROM) (not shown) to store code data to interface the host system.

The memory system 1100 may be implemented in a memory card or a solid state disk or drive (SSD) as a combination of the memory device 1120 and controller 1110. In one example, when the memory system 1100 is implemented as the SSD, the memory controller 1110 may communicate with an external device (e.g., host system) via various interface protocols such as USB, MMC, PCI-E, SATA, PATA, SCSI, ESDI, IDE, and or the like.

Figure 8:
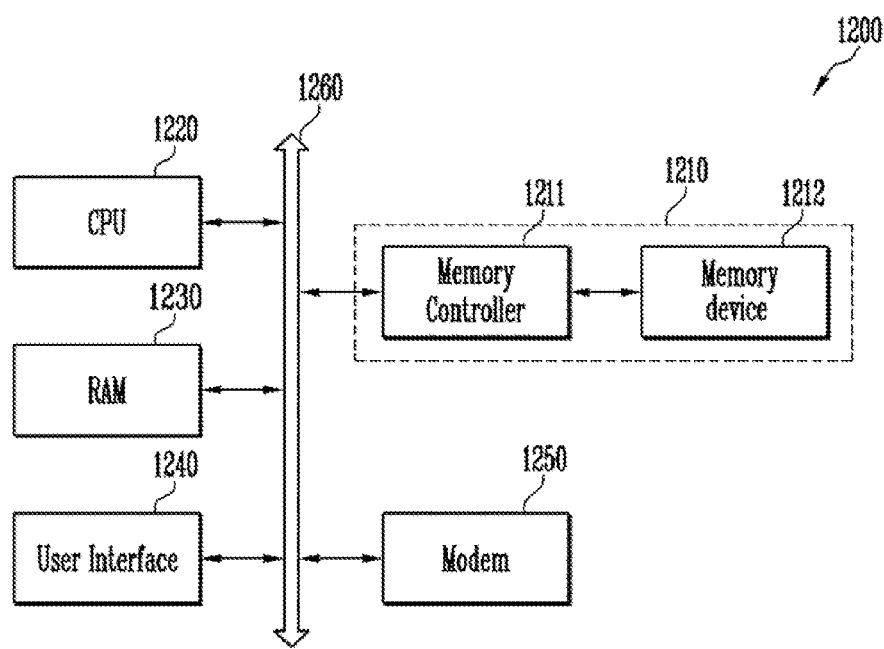
FIG. 8 illustrates a configuration diagram of a computing system, according to an embodiment of the present disclosure.

FIG. 8 illustrates a computing system 1200 according to an embodiment of the present disclosure. Referring to FIG. 8, the computing system 1200 may include a central processing unit (CPU) 1220, a random access memory (RAM) 1230, a user interface 1240, a modem 1250, and a memory system 1210, all of which are electrically connected to each other via a system bus 1260. Further, when the computing system 1200 is implemented in a mobile device, the computing system 1200 may be further provided with a battery (not shown) to supply an operation voltage thereof, and may be further provided with an application chipset, camera image processor (CIS), mobile DRAM, etc.

The memory system 1210 may include the memory device 1212, as above-mentioned in FIG. 7, and the memory controller 1211.

It is noted that the above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "an embodiment," or similar language means that a particular feature, structure, or characteristic that is described in connection with the embodiment is included in at least one embodiment of the present disclosure. Thus, appearances of the phrases "in an embodiment," and similar language throughout this specification may, but do not necessarily, all refer to the same embodiment.

What is claimed is:

1. A semiconductor device comprising:
a first stack including a plurality of alternating layers of first interlayer insulating layers and first conductive patterns;
a second stack including a plurality of alternating layers of second conductive patterns and second interlayer insulating layers, the second stack being positioned above the first stack;
a plurality of pillar-structures each pillar structure passing through the first and second stacks; and
a ring pattern layer disposed between the first and second stacks, the ring pattern layer comprising a plurality of ring patterns, each ring pattern surrounding each pillar-structure, wherein the ring patterns directly contact a lowermost second conductive pattern among the second conductive patterns and directly contact an uppermost first interlayer insulating layer among the first interlayer insulating layers.

2. The device of claim 1, wherein the lowermost second conductive pattern is adjacent to the first stack and the uppermost first conductive pattern is adjacent to the second stack.

3. The device of claim 1, wherein the ring patterns are made of a material different from a material of the second interlayer insulating layers.

4. The device of claim 1, wherein the ring patterns include at least one of Ti and TiN.

5. The device of claim 1, wherein each of the pillar-structures extends along a connection of first and second holes and a center hole, wherein the first hole passes through the first stack, the second hole passes through the second stack, and the center hole is defined by an inner wall of each of the ring patterns.

6. The device of claim 5, wherein each of the ring patterns screens a portion of the first stack around the first hole.

7. The device of claim 5, wherein a width of the center hole is equal to or smaller than a width of a topmost portion of the first hole.

8. The device of claim 5, wherein an edge of the second hole overlaps one of the ring patterns.

9. The device of claim 1, wherein each of the pillar-structures comprises:
a channel layer; and
a multi-layers structure surrounding the channel layer, the multi-layers structure including a data storage layer.

10. The device of claim 1, further comprising a source layer disposed below the first stack, the source layer contacting the pillar-structures.

11. The device of claim 1, further comprising:
a pipe gate disposed below the first stack; and
a pipe through-structure embedded in the pipe gate, the pipe through-structure being coupled to at least two of the pillar-structures.

12. The device of claim 11, wherein the pipe through-structure is monolithic with the at least two of the pillar-structures coupled thereto, wherein the pipe through-structure includes material layers extending from the pillar-structures.

13. The device of claim 1, further comprising a slit passing through the first and second stacks between the pillar-structures, wherein the slit is apart from the ring patterns.

* * * * *